United States Patent [19]

Telestad et al.

[11] 4,354,292

[45] Oct. 19, 1982

[54] ARRANGEMENT FOR CLEANING CIRCUIT CARDS PARTICULARLY FOR REMOVING SOLDERING AND RESIN REMNANTS

[75] Inventors: Åke W. Telestad, Skärholmen; Kjell A. Samuelsson, Saltsjö-Boo; Dick E. A. Storm, Lidingö, all of Sweden

[73] Assignee: Telefonaktiebolaget L M Ericsson, Stockholm, Sweden

[21] Appl. No.: 162,113

[22] Filed: Jun. 23, 1980

[30] Foreign Application Priority Data

Jul. 11, 1979 [SE] Sweden ............ 7906039

[51] Int. Cl.$^3$ ............ A46B 13/04

[52] U.S. Cl. ............ 15/77; 15/102; 15/103.5

[58] Field of Search ............ 15/21 C, 77, 3.13, 3.16, 15/3.18, 3.21, 30, 34, 40, 97 R, 100, 102, 21, 103.5

[56] References Cited

U.S. PATENT DOCUMENTS

| | | | |
|---|---|---|---|
| 2,158,694 | 5/1939 | Fenton | 15/77 X |
| 2,989,764 | 6/1961 | Peterson | 15/77 |

FOREIGN PATENT DOCUMENTS

| | | | |
|---|---|---|---|
| 1041007 | 9/1966 | United Kingdom | 15/77 |

*Primary Examiner*—Edward L. Roberts
*Attorney, Agent, or Firm*—Hane, Roberts, Spiecens & Cohen

[57] ABSTRACT

Arrangement for cleaning circuit cards particularly for removing soldering and resin remnants arising when soldering components on the card. The arrangement comprises a frame (FR) arranged in a container for a liquid cleaner. The frame carrying steering and driving wheels (DH) for two cleaning bands (T1, T2) running in a loop and in parallel with each other. The frame is provided with a guiding groove (R) for parallel guidance of the cleaning bands at such a distance from each other that it is possible to insert a circuit card between the bands. The bands are provided with bristles (B) of a determined height on their surfaces turned towards the cicuit card, in the chosen case 3 mm as a maximum, and the distance between the surface of the circuit card and the groove is such a way that the bristle fibres are bent at an angle of 45 degrees as a maximum when passing the card.

8 Claims, 3 Drawing Figures

SL
S
T2
R
S
DH
T1
FR
DH
TV

ARRANGEMENT FOR CLEANING CIRCUIT CARDS PARTICULARLY FOR REMOVING SOLDERING AND RESIN REMNANTS

FIELD OF THE INVENTION

The invention relates to an arrangement for cleaning circuit cards particularly for removing soldering and resin remnants arising when soldering components on the circuit cards.

DESCRIPTION OF PRIOR ART

It is known to wash away soldering and resin remnants from circuit cards by means of brushes rotating in a bath containing a cleaner. Also manual washing methods are known.

SUMMARY OF THE INVENTION

The disadvantages with the known methods are the difficulty to achieve a complete cleaning with the brushes and the risk of damage of the components due to contact with the brushes. Furtheremore large quantities of cleaner splash onto the circuit cards which, besides causing a large consumption of cleaner, can damage the cards. A further problem is the inconveniences the operator is subjected to by vapor and, splash from the cleaner and of course, by direct contact with the cleaner.

The arrangement according to the invention, for solving the above problem, comprises a frame arranged in a container for a cleaner which frame carries guide and driving wheels for two cleaning bands running in a loop and in parallel with each other. The frame is provided with a guiding groove for parallel guidance of the cleaning bands at such a spacing from each other that it is possible to insert a circuit card between the bands. The bands are provided with bristles of a determined height on their surfaces turned towards the circuit card, in the chosen case of 3 mm as a maximum, and the distance between the surface of the circuit card and the groove is chosen at such a way that the bristle fibres are bent maximally in an angle of 45 degrees when passing the card.

The arrangement according to the invention offers, besides a more advantageous technical and economical solution than earlier known methods, the following advantages: greater cleaning accuracy; considerably less cleaner consumption; reduced cleaning time; advantages of industrial hygiene including: no vapor, no splash and no direct contact with the cleaner.

BRIEF DESCRIPTION OF THE DRAWINGS

The arrangement according to the invention will be described in detail by means of an embodiment with reference to the accompanying drawings wherein.

DETAILED DESCRIPTION OF A PREFERRED EMBODIMENT

Figure 1:
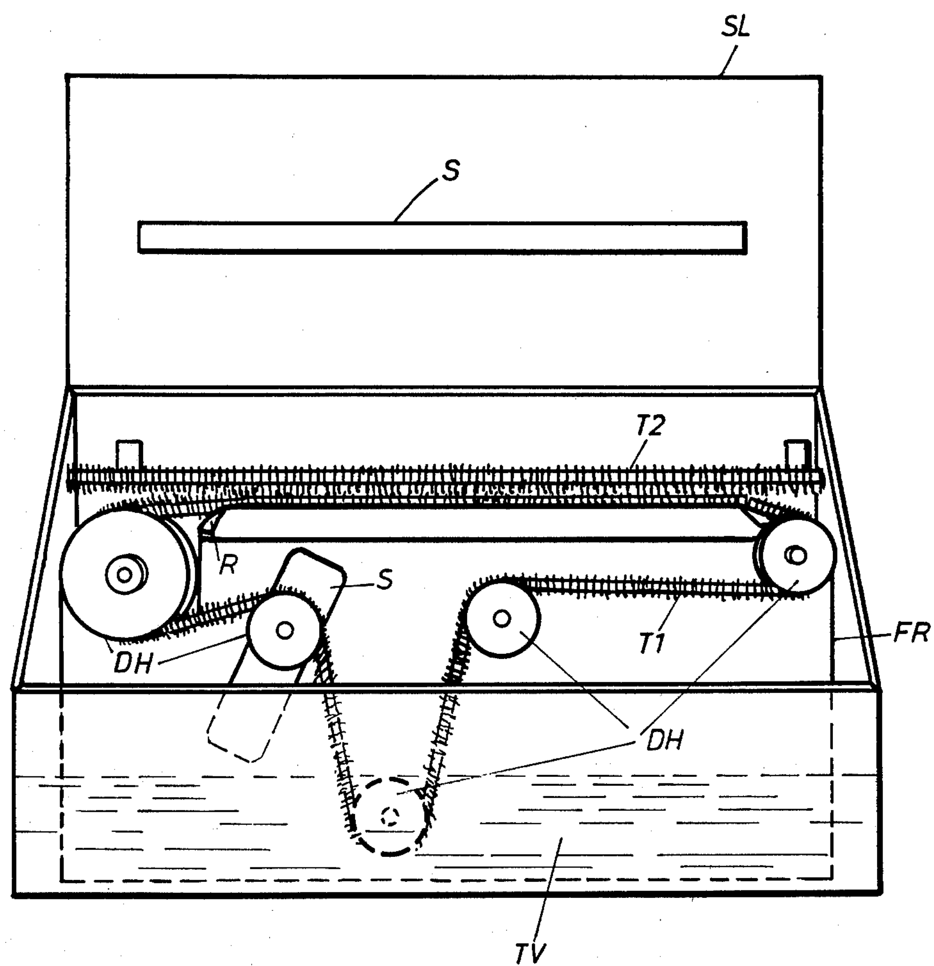
FIG. 1 is a front perspective view from above, of the arrangement according to the invention.

As appears from FIG. 1 and arrangement according to the invention comprises two cleaning bands T1, T2 each rotating around a set of guiding and driving wheels DH, the bands when rotating around the driving wheels passing through a bath containing a cleaner TV.

A mounting frame FR, consisting of an angle-shaped mounting plate on the side surfaces of which the driving wheels are mounted, is provided with a groove R in the longitudinal direction of the mounting plate. By the construction of the mounting frame, the cleaning bands T1, T2 placed around the driving wheels on respective side surface, will run in parallel in the groove R. The bands run in the groove at such a spacing from each other that it is possible to insert a circuit card which is to be cleaned between the bands. The groove R limits the extent of insertion of the card into the frame. This serves to prevent the disadvantage of the prior art construction in which the brushes can contact the components and damage the same.

In order to maintain a constant stretching of the cleaning bands one of the driving wheels DH on each side surface is movable in a track S by means of a spring-loaded stretching device.

Figure 2:
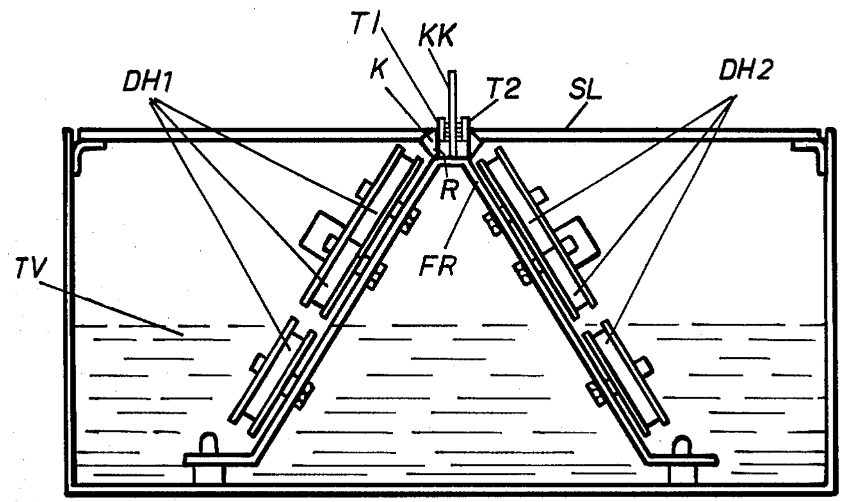
FIG. 2 shows the arrangement from the side.

In FIG. 2 the arrangement is shown from the side. The angle-shaped mounting frame FR carries the set of driving wheels DH1 around which the cleaning band T1 rotates, and the set of driving wheels DH2 around which the cleaning bands T2 rotates. The bent edges K at the end of the groove R serve to guide the bands rotating around the respective sets of driving wheels into the groove.

Figure 3:
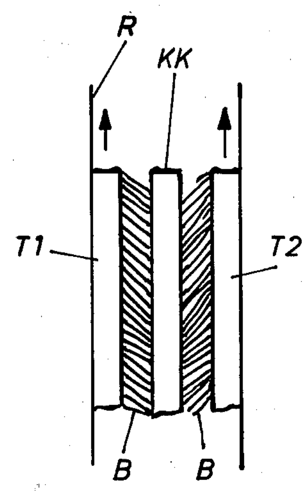
FIG. 3 shows the contact between the brush fibres and the side surfaces of a circuit card in detail.

In FIG. 3 part of the arrangement is shown from above. To achieve as effective a cleaning as possible, it is important that the bristle fibres B on the cleaning bands be of a determined length in comparison to the distance between the surface of the circuit card and the inner wall of the groove R, a certain inclination of the bristles being obtained and consequently an optimal cleaning effect. In the embodiment, the length of the bristle fibres is chosen as 3 mm, as a maximum, and the inclination when there is contact with a circuit card will then be 45 degrees. From the figure it is seen that the cleaning bands T1, T2 run in parallel at a distance from each other in the groove R in the direction of the arrows. Furthermore, it is seen how the bristles B on the cleaning bands are in contact with the sides of a circuit card KK inserted between the bands. When the bands travel in the direction of the arrows the bristles are bent at an angle of 45 degrees when they come into contact with the card.

A cleaning process, by the means of the arrangement according to the invention, is performed when a circuit card is inserted between the cleaning bands T1, T2 each being provided with bristles B, the bristles being pressed against the sides of the circuit card at the same time that the bands travel forwards. The cleaning bands are so stretched that most of the cleaner is squeezed out of the bands when these come in contact with the driving wheels placed after the cleaning bath. Consequently, it is bands moistened with cleaner which perform the cleaning of the circuit cards. As the bands press against the sides of the circuit card with a constant pressure, a very accurate cleaning is obtained. By virtue of the fact that the bands are squeezed considerably less cleaner is utilized than in known methods; furthermore splash and soaking of the circuit cards are minimized. The arrangement is, as appears from FIG. 1, also provided with a protection lid SL in which a track or slot S is arranged corresponding to the groove R in the mounting frame FR. The protection lid can be lowered over the bands so that these are reachable through the track in the lid, i.e., a circuit card can be inserted between the bands when the protection lid is closed. By virtue of the protection lid, the problem of splash and vapor is eliminated.

What we claim is:

1. Apparatus for cleaning circuit cards to remove solder and resin remnants due to the soldering of components onto the cards, said apparatus comprising container means containing a cleaning liquid, a frame carrying first and second sets of guiding and driving wheels and respective first and second endless cleaning bands on said wheels driven thereby and immersed in said liquid along a portion of the travel thereof, said frame being provided with a guide groove located outside said liquid, said cleaning bands having respective lengths extending in confronting parallel relation in said guide groove and being driven in the same direction by said wheels in said groove, each said band including flexible bristles thereon extending from said band towards the bristles of the other band, said guide groove being outwardly open to permit insertion of a circuit card to be cleaned into said groove, the length of said bristles in relation to the size of said groove being such to cause said bristles of the confronting bands to be pressed against said card and undergo flexing as said bands travel along said card.

2. Apparatus as claimed in claim 1 wherein said bristles have a projection length of 3 mm from said bands.

3. Apparatus as claimed in claim 2 wherein said bristles are bent at an angle of 45° as a maximum when passing said card.

4. Apparatus as claimed in claim 1 wherein said frame includes two opposite inclined surfaces on which said first and second sets of wheels are mounted.

5. Apparatus as claimed in claim 4 wherein said guide groove has an entrance into which said lengths of said bands enter, said guide groove having bent edges at said entrance for guiding said lengths of said bands into said guide groove.

6. Apparatus, as claimed in claim 4 wherein said guide groove is located above the cleaning liquid and is upwardly open to permit the card to be cleaned to be inserted from above into said guide groove, said lengths of said bands extending horizontally in said guide groove in facing coplanar relation.

7. Apparatus as claimed in claim 6 comprising a raisable cover means for covering said container means, said cover means being provided with a slot which is in correspondence with said groove.

8. Apparatus as claimed in claim 1 wherein said groove is sized to limit the extent of insertion of the card into the frame.

* * * * *